US00RE36236E

United States Patent [19]

Shimizu et al.

[11] E Patent Number: Re. 36,236

[45] Reissued Date of Patent: Jun. 29, 1999

[54] SEMICONDUCTOR MEMORY DEVICE

[75] Inventors: Mitsuru Shimizu, Sakura, Japan; Syuso Fujii, Hopewell Jct, N.Y.

[73] Assignee: Kabushiki Kaisha Toshiba, Kawasaki, Japan

[21] Appl. No.: 08/475,378

[22] Filed: Jun. 7, 1995

Related U.S. Patent Documents

Reissue of:

[64] Patent No.: 5,142,492
Issued: Aug. 25, 1992
Appl. No.: 07/591,948
Filed: Oct. 2, 1990

U.S. Applications:

[63] Continuation of application No. 08/293,319, Aug. 22, 1994, abandoned.

[30] Foreign Application Priority Data

Oct. 5, 1989 [JP] Japan ..... 1-260871

[51] Int. Cl.[6] ..... G11C 13/00

[52] U.S. Cl. ..... 365/51; 365/182; 365/189.01; 365/206

[58] Field of Search ..... 365/51, 182, 189.01, 365/206, 207

[56] References Cited

U.S. PATENT DOCUMENTS

| | | | |
|---|---|---|---|
| 4,660,174 | 4/1987 | Takamae . | |
| 4,736,271 | 4/1988 | Mack et al. | 361/91 |
| 5,504,704 | 4/1996 | Sato et al. | 365/182 |

FOREIGN PATENT DOCUMENTS

| | | |
|---|---|---|
| 0 130 798 | 1/1985 | European Pat. Off. . |
| 60-9152 | 1/1985 | Japan . |
| 60-251643 | 12/1985 | Japan . |
| 3-214669 | 9/1991 | Japan . |

OTHER PUBLICATIONS

Syuso Fujii et al., "A 45ns 16Mb DRAM with Triple-Well Structure"; 1989 IEEE International Solid-State Circuits Conference; pp. 248–249 and 354.

Tomio Nakano et al., "A Sub-100 ns 256K DRAM With Open Bit Line Scheme"; IEEE J. Solid-State Circuits, pp. 452–456; vol. SC-18, No. 5 (1983).

*Primary Examiner*—Terrell W. Fears
*Attorney, Agent, or Firm*—Banner & Witcoff

[57] ABSTRACT

A semiconductor memory device is disclosed which comprises a regular row/column memory cell array having blocks obtained by dividing the memory cell array in the column and row directions, *the blocks each being further divided in the column direction to form a plurality of sections,* a first peripheral circuit [irregularly] provided between the blocks divided in the column direction, a second peripheral circuit provided between the blocks divided in the row direction and including a first decoder, a third peripheral circuit provided between the first peripheral circuit and the respective block and including a second decoder, and [a fourth peripheral circuit provided at the marginal portion of the memory cell array and including bonding pads and input protection circuit] *sense amplifiers provided between neighboring sections in each of the blocks.*

73 Claims, 4 Drawing Sheets

SEMICONDUCTOR MEMORY DEVICE

Matter enclosed in heavy brackets [ ] appears in the original patent but forms no part of this reissue specification; matter printed in italics indicates the additions made by reissue.

*This application is a continuation of application Ser. No. 08/293,319, filed Aug. 22, 1994 now abandoned.*

BACKGROUND OF THE INVENTION

1. Field of the Invention

The present invention relates to a semiconductor memory device and, in particular, an improvement in a chip layout of a memory cell array.

2. Description of the Related Art

A conventional semiconductor memory device, such as a dynamic RAM (hereinafter referred to as a DRAM) and static RAM (hereinafter referred to as SRAM), has a chip layout as shown in FIG. 1.

A memory cell array area 12 is formed at the central area of a semiconductor chip 11. An area 13 other than a peripheral circuit area, bonding pad area and input protection circuit, is formed at an outer marginal portion of the memory cell array 12. A row decoder 14 is formed relative to a row direction of the memory cell array area 12 and a column decoder 15 is formed relative to the column direction of the memory cell array area 12.

The chip layout of the DRAM or SRAM is broadly divided into the memory cell array area 12 and the rest, that is the area 13, of the chip layout. The memory cell array area 12 includes memory [cell arrays] *cells* regularly arranged relative to a word line (WL) [or] *and a* bit line (BL), decoders for selecting the memory [cell arrays] *cells*, sense amplifier for amplifying data supplied from the memory cell [array], and so on. The area 13 includes an irregular peripheral circuit which is not formed for each WL and BL, and so on.

An increase in size of the memory cell array area 12 is caused due to an increase in capacity of memory. In a DRAM or SRAM of the aforementioned chip layout, there is a large increase in resistance and capacitance at a location of WL and BL. That is, a large increase in the resistance and capacitance leads to a signal delay on WL and BL and a further increase in charging/discharging current $I_{BL}$ on BL.

In connection with a signal delay on WL and BL, let it be assumed that the connection length l of WL and BL is doubled due to an increase in size of, for example, a memory cell array. In this case, the resistance R ( l) is doubled at WL and BL and the capacitance C ( l) is doubled there. Since the signal delay time td is proportional to the resistance R and capacitance C, the signal delay at WL and BL is increased by a factor of 4. Stated in another way, when the connection length l is increased by a factor of n, then a signal transmission is delayed by a factor of $n^2$.

In connection with an increase in the charging/discharging current $I_{BL}$ at BL, let it be assumed that, for example, a capacitance $C_B$ is doubled at BL. In this case, the charging/discharging current $I_{BL}$ is doubled at BL because it is proportional to the capacitance $C_B$. That is, $$I_{BL} = \frac{Q}{t_{RC}} = \frac{C_V}{t_{RC}} = \frac{C_B \times \text{SA number} \times V}{t_{RC}}$$

$$I = I_{BL} + I_{peri}$$

where $t_{RC}$ denotes a cycle time; Q, an amount of charge; V, a voltage; SA number, the number of sense amplifiers; I, an operation current; and $I_{peri}$, a dissipation current at the peripheral circuit area.

As will be appreciated from the above, a factor-of-n increase in the capacitance $C_B$ at BL results in a factor-of-n increase in the charging/discharging current $I_{BL}$. It is to be noted that an increase in the charging/discharging current $I_{BL}$ serves additively as an operation current I.

In this way, a signal delay at WL and BL prevents achievement of a high-speed semiconductor memory device and causes an operation error at a subsequent circuit. This problem is common to all the connection lines irrespective of WL and BL.

Further, an increase in the charging/discharging current $I_{BL}$ exerts a greater influence on the characteristic of the device because 60 to 70% of the operation current I is governed by the charging/discharging current $I_{BL}$.

It is known that, if the memory cell array area 12 is located at the central area of a semiconductor chip with the rest of the chip, that is the area 13, arranged as a peripheral area, the peripheral circuit blocks increase in number. The increase in the number of the peripheral circuit blocks increases a dissipation current $I_{peri}$ there and hence an operation current I correspondingly increases, adversely affecting the characteristic of the device.

SUMMARY OF THE INVENTION

It is accordingly the object of the present invention to provide a semiconductor memory device which can be achieved as a high-speed unit having decreased power dissipation despite an increase in capacity of its memory.

According to the present invention there is provided a semiconductor device comprising:

a regular row/column memory cell array having four blocks obtained by dividing the memory cell array in the column and row directions [with the respective two located in a regular array], *wherein the four blocks are each divided in the column direction to form a plurality of sections*;

a first peripheral circuit provided [in an irregular fashion] between the blocks divided in the column direction of the regular row/column memory cell array;

a second peripheral circuit provided between adjacent blocks divided in the row direction of the regular row/column *memory* cell array and including a first decoder;

a third peripheral circuit provided in the column direction between the first peripheral circuit and the respective adjacent block and including a second decoder; and

[a fourth peripheral circuit provided at an outer marginal portion of the memory cell array and including bonding pads and input protection circuit] *sense amplifiers provided between neighboring sections in each of the four blocks.*

According to another embodiment of the present invention, a semiconductor memory device is provided, comprising:

a regular row/column memory cell array having eight blocks obtained by dividing the memory cell array in the column and row directions with [the respective four located in a regular array] *four of the eight blocks being arranged* in the [column] *row* direction, *wherein the eight blocks are each divided in the column direction to form a plurality of sections*;

a first peripheral circuit [formed in an irregular fashion] *provided* between the blocks divided in the column direction of the regular row/column memory cell array;

a second peripheral circuit provided between a respective pair of blocks divided in the row direction of the regular row/column *memory* cell array and including a first decoder;

a third peripheral circuit provided in the column direction between the first peripheral circuit and the respective block and including a second decoder; and

[a fourth peripheral circuit provided at an outer marginal portion of the memory cell array, including an area between the adjacent pairs of blocks, said fourth peripheral circuit including bonding pads and input protection circuit] *sense amplifiers provided between neighboring sections in each of the eight blocks.*

According to another embodiment, a semiconductor memory device is provided, comprising:

a regular row/column memory cell array having an l×m number (l, m: a natural number) of blocks obtained by dividing the memory cell array in the column and row directions corresponding to l and m, respectively, *wherein said blocks are each divided in the column direction to form a plurality of sections*:

[a] *an irregular* first peripheral circuit provided [in an irregular fashion] between the blocks divided in the column direction of the regular row/column memory cell array;

a second peripheral circuit provided between a respective pair of blocks divided in the row direction of the regular row/column *memory* cell array and including a first decoder;

a third peripheral circuit provided in the column direction between the first peripheral circuit and the respective block and including a second decoder; and

[a fourth peripheral circuit provided at an outer marginal portion of the memory cell array, including an area between the adjacent pairs of blocks, said fourth peripheral circuit including bonding pads and input protection circuit] *sense amplifiers provided between neighboring sections in said blocks.*

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

Detailed Description of the Preferred Embodiments

Figure 1:
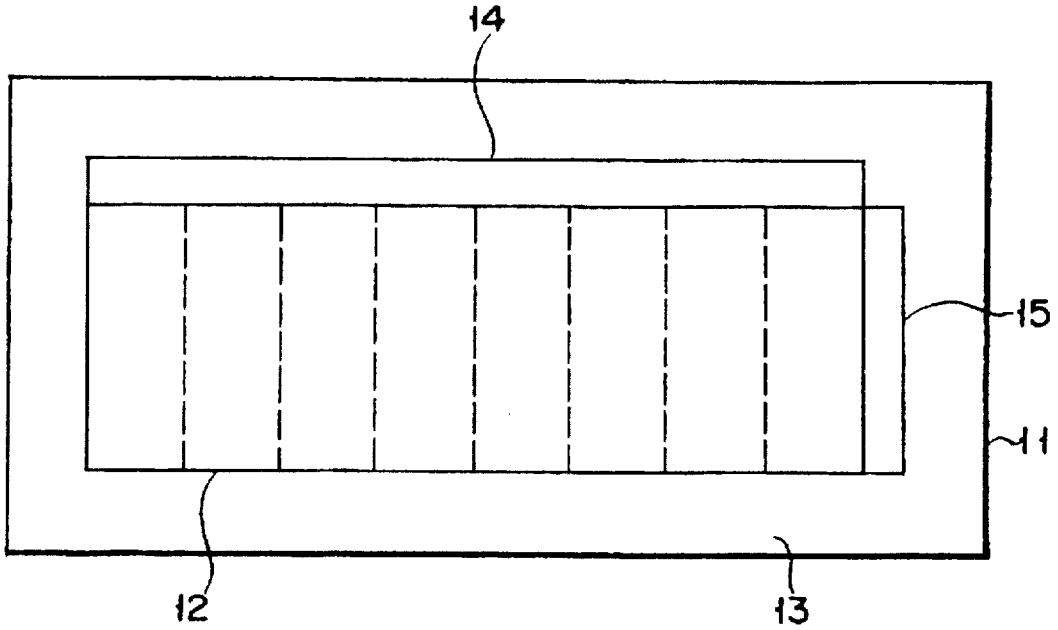
FIG. 1 (PRIOR ART)
FIG. 1 is a plan view showing a chip layout pattern showing a conventional semiconductor apparatus.

One embodiment of the present invention will be explained below with reference to the accompanying drawings. Like reference numerals are employed to designate like parts or elements throughout the drawings and further explanation is omitted for brevity's sake FIG. 2 shows the chip layout of a semiconductor memory device according to one embodiment of the present invention.

Figure 3:
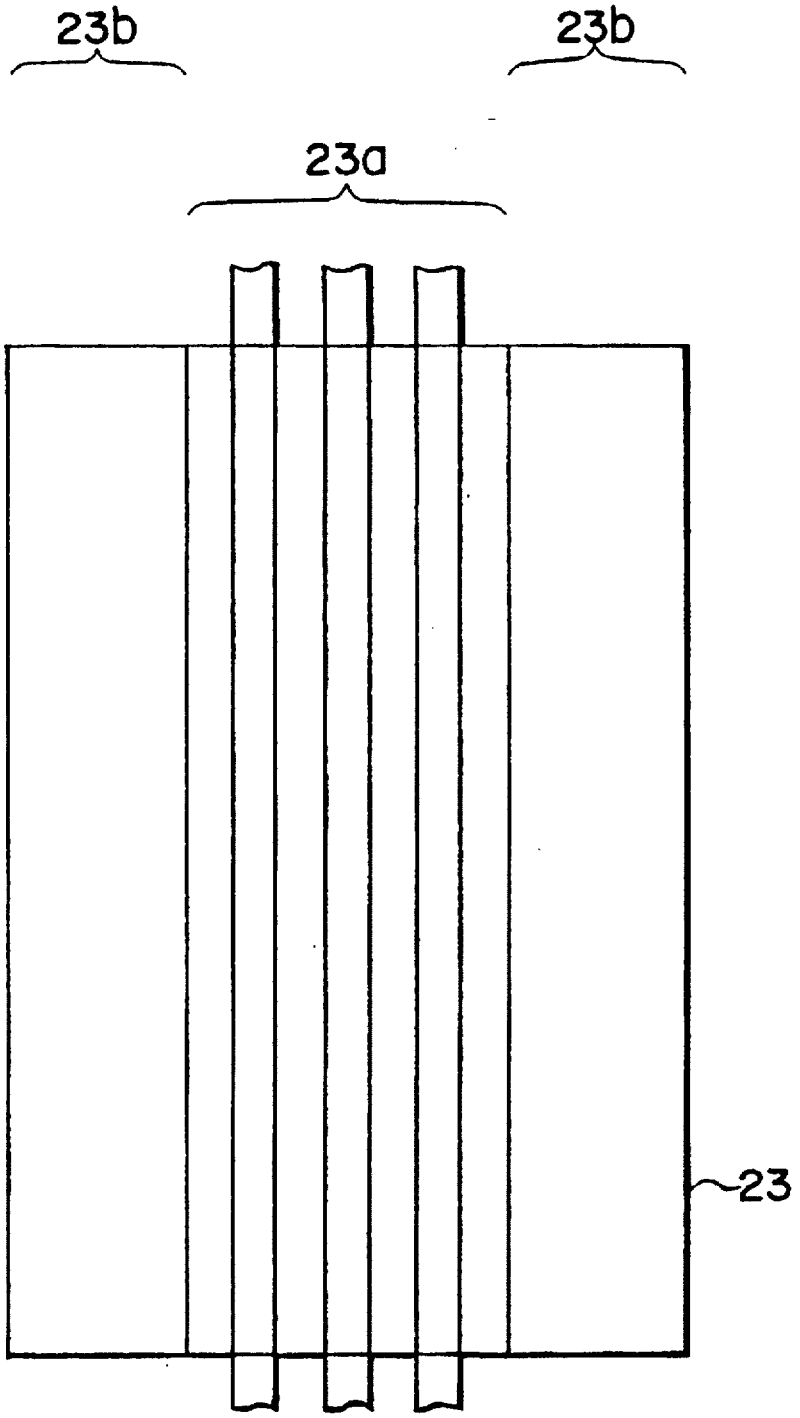
FIG. 3 is an enlarged view showing an irregular peripheral memory circuit 23 in the semiconductor device of FIG. 2.

A row/column memory cell array is formed, as a regular array, at the central area of a semiconductor chip 21. The regular memory cell array has four blocks obtained by dividing the memory cell array in the row and column directions with the respective two located as upper and lower blocks, that is, with blocks 22a and 22b and blocks 22c and 22d, located relative to an irregular peripheral circuit (first *irregular* peripheral circuit) 23. As shown, for example, in FIG. 3, the peripheral circuit 23 includes a bus line 23a composed of a group of signal lines and a peripheral circuit block 23b provided at each side of the bus line 23a. The signal lines are connected to a row decoder (RDC). Peripheral circuits (second peripheral circuits) 24a and 24c, including an RDC (first decoder), are formed one between the blocks 22a, 22b in the memory cell array and one between the blocks 22a, 22c in the memory cell array in the row direction of the memory cell array. The peripheral circuit 24a is shared by the adjacent blocks 22a and 22b in the memory cell array and the peripheral circuit 24c is shared by the adjacent blocks 22c and 22d. A peripheral circuit (third peripheral circuit) 25, including a column decoder (CDC), is formed between the peripheral circuit 23 and each of the respective blocks 22a, . . . , 22din the memory cell array.

Figure 2:
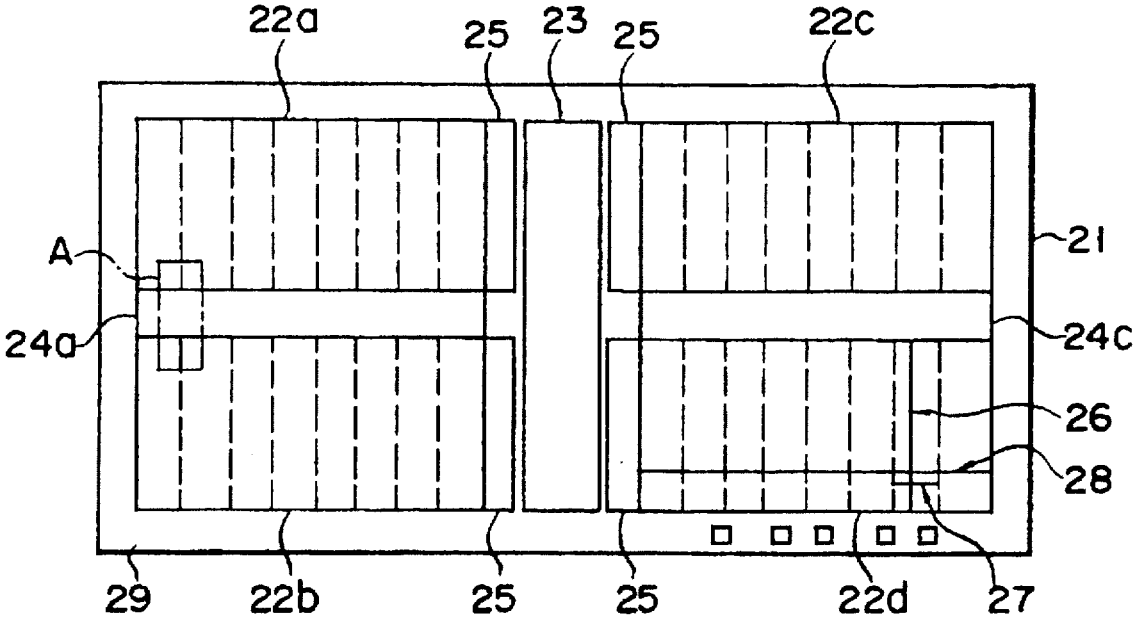
FIG. 2 is a plan view showing a chip layout pattern of a semiconductor memory device according to one embodiment of the present invention.

The respective blocks 22a, . . . , 22d are each divided by $2^n$ (n: a natural number ) in the column direction and, in the case of the embodiment shown in FIG. 2, divided into eight sections (minimal memory units) as indicated by dotted lines in FIG. 2. WL 26 and BL 27 are arranged, relatively in the column and row directions, for the sections of the respective blocks. A column select line (CSL) 28 is arranged relative to BL 27 such that it extends through the memory cell array area. Further, a peripheral circuit (fourth peripheral circuit) 29, including bonding pads and input protection circuit, is formed at the marginal portion of a semiconductor chip, that is, at the peripheral portion of the memory cell array. The peripheral circuit 29 may include an irregular peripheral circuit as required.

Figure 4:
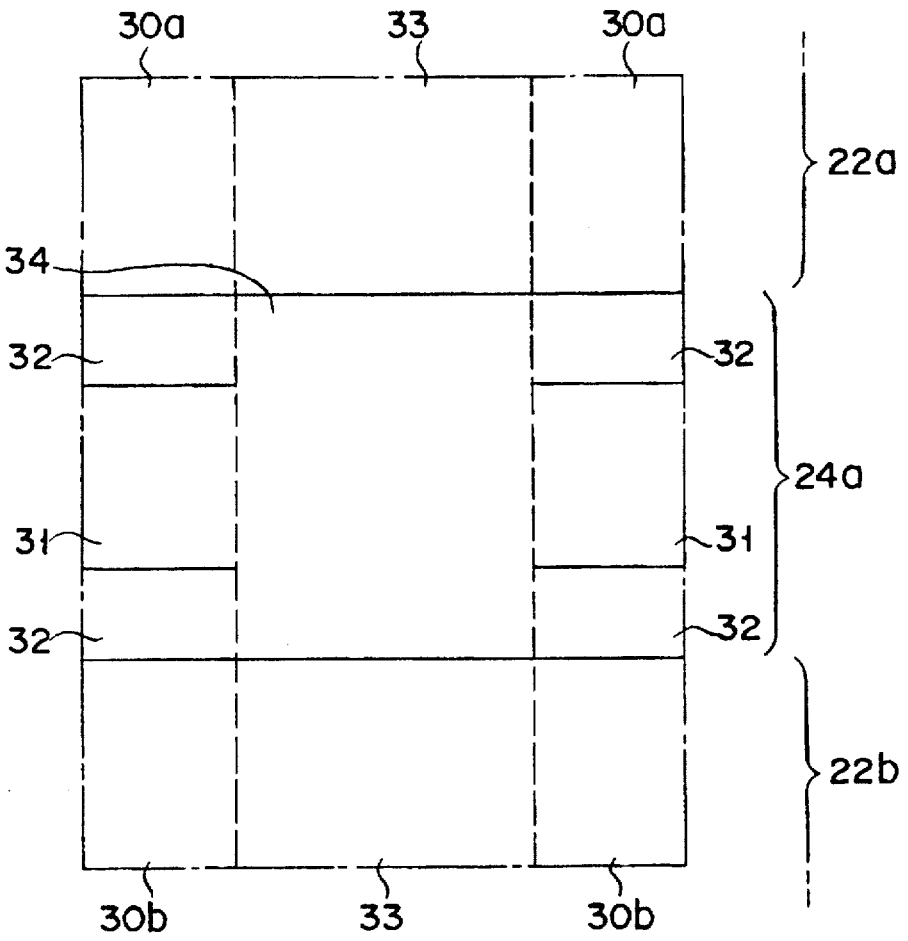
FIG. 4 is an enlarged view showing a peripheral circuit including an RDC.

FIG. 4 is an enlarged view, as indicated by A in FIG. [1] *2*, showing the peripheral circuit area 24a.

A circuit (row decoder) 31 for selecting an address is provided between the sections 30a, 30a on one hand in the block 22a and the sections 30b, 30b in the block 22b on the other hand and shared by the adjacent sections 30a and 30b. A circuit 32 for driving the WL is formed, for every section (30a, 30b), between the circuit 31 and the sections 30a, 30b. A sense amplifier, gating circuit *33* and so on are formed between the neighboring sections 30a, 30a and between neighboring sections 30b, 3Ob. An address select circuit, redundancy circuit, fuse *34* and so on can be provided at a location surrounded by the sections 30a and 30b.

In the aforementioned memory cell array, four blocks 22a to 22d are provided with the circuit 23, as well as the peripheral circuits 24a, 24c including the RDC, arranged between the corresponding blocks 22a, . . . , 24c. It is thus possible to decrease the number of memory cells to be connected to the WL and to make the connection lengths of the WL and BL short. The peripheral circuit 24a is shared by the blocks 22a and 22b in the row direction and the peripheral circuit 24c is shared by the blocks 22c and 22d in the row direction. It is, therefore, possible to commonly use the signal connection lines for the RDC and to reduce the size of the semiconductor chip.

Figure 5:
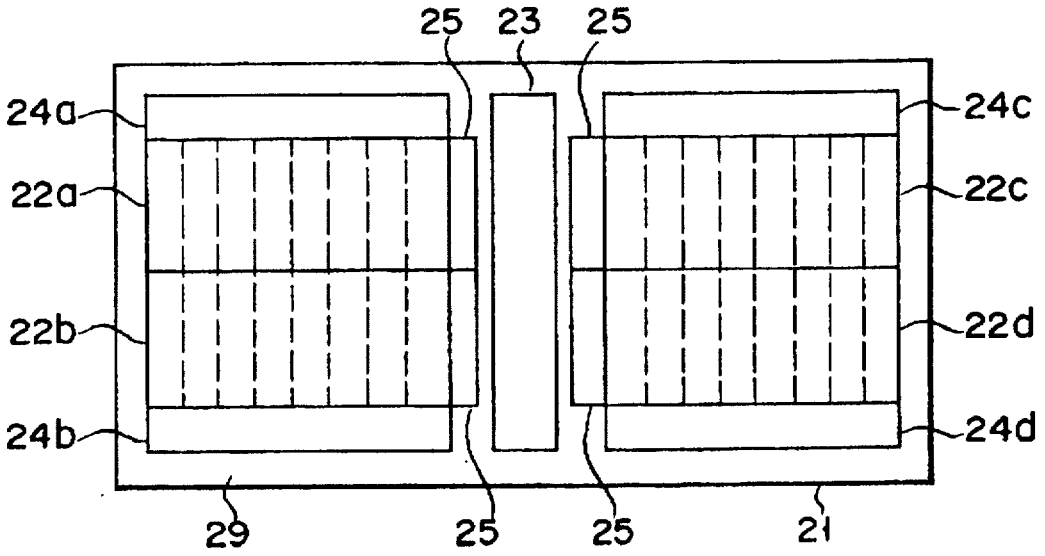
FIGS. 5 and 6, each, show a semiconductor memory device according to another embodiment of the present invention.

As shown in FIG. 5, peripheral circuits 24a, . . . , 24d, including an RDC, may be provided relative to blocks 22a, . . . , 24d, respectively, in which case a problem is undesirably involved due to a resistance, chip area, capacitance, etc., of control signal lines for RDC.

Respective blocks 22a, . . . , 22d in the memory cell array are divided by $2^n$ (n: a natural number) to provide sections 30a, 30b. In this way, the [row] *column direction* can be selected in units of the sections 30a, 30b, ensuring further division of the [WL] *BL*. This arrangement shortens the WL, BL, [signal connection lines,] etc., thus making it possible to reduce the connection capacitance, resistance, etc. Further, the resultant arrangement obviates the need to provide any extra circuit blocks and hence contributes much to achieving a high-speed device of less dissipation power. As in the case of a 16M DRAM, in order to achieve a high-capacity memory and improve a connection delay of the WL and BL as well as the characteristic of the device, such as the charging/discharging current of the BL, it is very advantageous to broadly divide the memory cell array into four blocks.

Various changes or modifications of the present invention can be made without restricting the present invention to the preceding embodiment.

Figure 6:
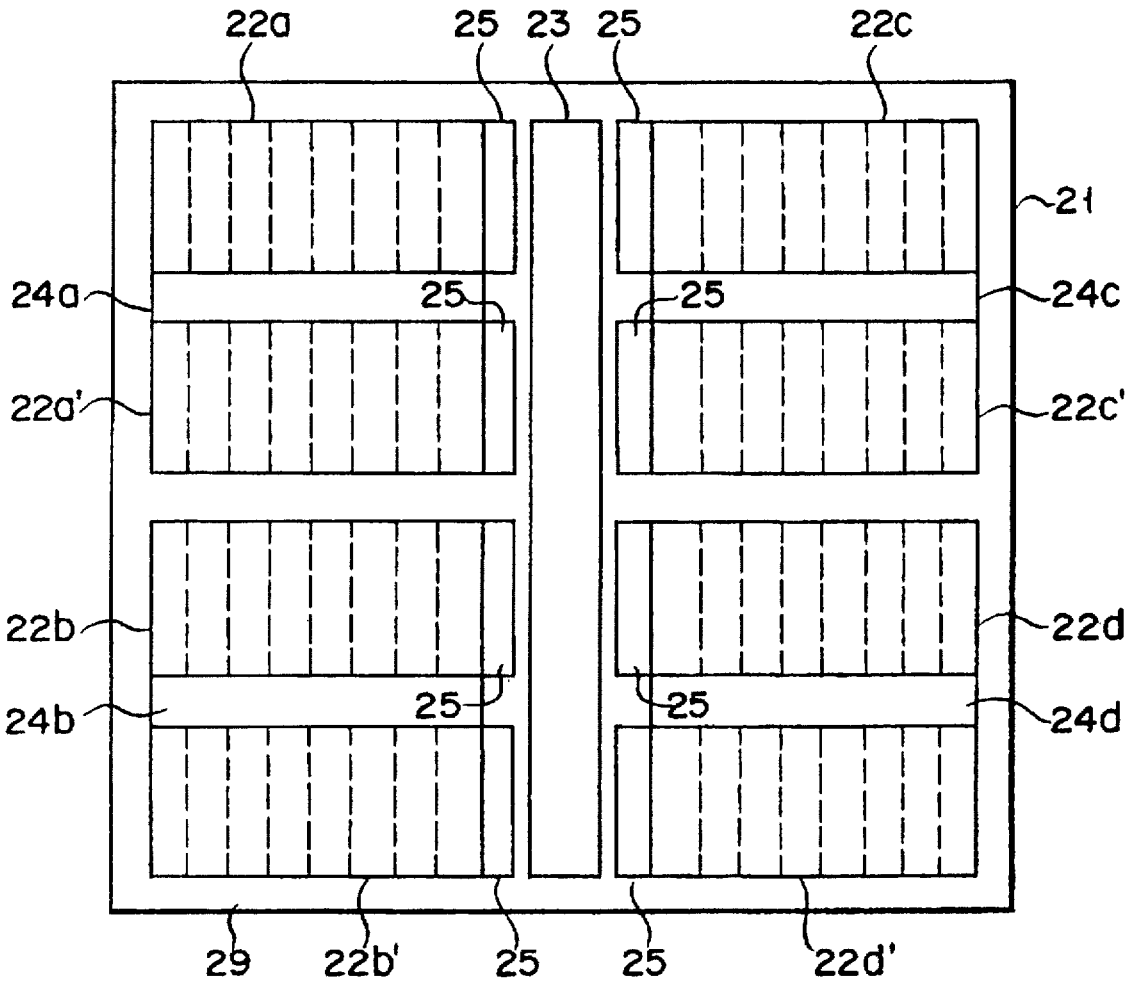

FIG. 6 shows a chip layout of a semiconductor device in which four divided blocks are further divided in the row direction of a memory cell array to provide eight blocks as shown in the figure.

Stated in another way, the memory cell array is divided at the middle column line into two segments with the respective segment composed of four blocks (22a, 22a', 22b, 22b'and 22c, 22c', 22d, 22d'). An irregular peripheral circuit (first *irregular* peripheral circuit) 23 is provided between the blocks 22a, 22a', 22b, 22b'at one side and the blocks 22c, 22c', 22d, 22d'at the other side of the memory cell array.

A peripheral circuit 24a including an RDC (first decoder) is provided between the blocks 22a and 22a'; a peripheral circuit 24b including an RDC, between the blocks 22b and 22b'; a peripheral circuit 24c including an RDC, between the blocks 22c and 22c'; and a peripheral circuit 24d including an RDC, between the blocks 22d and 22d'. These peripheral circuits 24a to 24d are each shared by the adjacent blocks. A peripheral circuit (third peripheral circuit) 25 including a CDC (second decoder) is provided between the peripheral circuit 23 and each of the blocks 22a to 22d and 22a'to 22d.

The respective blocks 22a to 22d and 22a'to 22d'in the memory cell array are each are divided by $2^n$ (n: a natural number) into sections in the column direction of the memory cell array (in the present embodiment, each is divided into eight sections as indicated by the dotted line in FIG. 6). A peripheral circuit (fourth peripheral circuit) 29 including a bonding pad area and input protection circuit is provided at the marginal portion of the semiconductor chip 21, that is, at that peripheral portion of the memory cell array which includes an area between the adjacent pairs of blocks 22a, 22a'; 22b, 22b'; 22c, 22c'; and 22d, 22d'.

In this embodiment, the memory cell array includes the eight blocks 22a, . . . , 22d and 22a'to 22d', and an irregular peripheral circuit 23 and peripheral circuits 24a to 24d including an RDC are provided between the adjacent ones of these blocks as shown in FIG. 6. It is thus possible to obtain the same advantage as set out in connection with the embodiment of FIG. [1] 2.

Additional advantages and modifications will readily occur to those skilled in the art. Therefore, the invention in its broader aspects is not limited to the specific details, and representative devices, shown and described. Accordingly, various modifications may be made without departing from the spirit or scope of the general inventive concept as defined by the appended claims and their equivalents.

What is claimed is:

1. A semiconductor memory device comprising:

a regular row/column memory cell array having four blocks obtained by dividing the memory cell array in the column and row directions, *wherein said four blocks are each divided in the column direction to form a plurality of sections*;

a first peripheral circuit provided between the blocks divided in the column direction of the regular row/column memory cell array, *wherein each of said sections further includes a bit line extending in the column direction and each of said blocks includes a column select line extending parallel to said bit lines and across the sections*;

a second peripheral circuit provided between adjacent blocks divided in the row direction of the regular row/column *memory* cell array and including a first decoder, *wherein each of said sections includes a word line extending in the row direction and coupled to said second peripheral circuit*;

a third peripheral circuit provided in the column direction between the first peripheral circuit and the respective adjacent block and including a second decoder; and

[a fourth peripheral circuit provided at an outer marginal portion of the memory cell array and including bonding pads and input protection circuit]

*sense amplifiers provided between neighboring sections in each of said four blocks.*

2. The semiconductor memory device according to claim 1, wherein [the respective block in said regular row/column memory cell array] *each of said four blocks* is divided [by] *into* $2^n$ (n: a natural number) [into] sections, [the] *each* section constituting a minimal memory *cell* array unit.

3. The semiconductor memory device according to claim 1, wherein said first decoder is shared by adjacent blocks in said memory cell array.

4. The semiconductor memory device according to claim 1, wherein said first decoder [is composed of] *comprises* a row decoder.

5. The semiconductor memory device according to claim 1, wherein said second decoder [is composed of] *comprises* a column decoder.

6. A semiconductor memory device comprising:

a regular row/column memory cell array having eight blocks obtained by dividing the memory cell array in the column and row directions with four of the eight blocks being arranged in the [column] *row* direction, *wherein said eight blocks are each divided in the column direction to form a plurality of sections*;

a first peripheral circuit formed between the blocks divided in the column direction of the regular row/column memory cell array;

a second peripheral circuit provided between a respective pair of blocks divided in the row direction of the regular row/column *memory* cell array and including a first decoder;

a third peripheral circuit provided in the column direction between the first peripheral circuit and the respective block and including a second decoder; and [a fourth peripheral circuit provided at an outer marginal portion of the memory cell array, including an area between the adjacent pairs of blocks, said fourth peripheral circuit including bonding pads and input protection circuit]

*sense amplifiers provided between neighboring sections in each of said eight blocks.*

7. The semiconductor memory device according to claim 6, wherein [a respective block in said memory cell array] *each of said eight blocks* is divided [by] *into* $2^n$ (n: a natural number) [into] sections, [the] *each* section constituting a minimal memory *cell array* unit.

8. The semiconductor memory device according to claim 6, wherein said first decoder is shared by adjacent blocks in said memory cell array.

9. The semiconductor memory device according to claim 6, wherein said first decoder [is composed of] *comprises* a row decoder.

10. The semiconductor memory device according to claim 6, wherein said second decoder [is composed of] *comprises* a column decoder.

11. A semiconductor memory device comprising:

a regular row/column memory cell array having an l×m number (l, m: a natural number) of blocks obtained by dividing the memory cell array in the column and row directions corresponding to l and m, respectively, *wherein said blocks are each divided in the column direction to form a plurality of sections*;

[a] *an irregular* first peripheral circuit provided [in an irregular fashion] between the blocks divided in the column direction of the regular row/column memory cell array;

a second peripheral circuit provided between a respective pair of blocks divided in the row direction of the regular row/column *memory* cell array and including a first decoder;

a third peripheral circuit provided in the column direction between the first peripheral circuit and the respective block and including a second decoder; [and]

a fourth peripheral circuit provided at an outer marginal portion of the memory cell array, including an area between the adjacent pairs of blocks, [and] *said* fourth peripheral circuit [and] including bonding pads and input protection [circuit] *circuitry; and*

*sense amplifiers provided between neighboring sections in said blocks.*

12. A semiconductor memory device according to claim 11, wherein [the respective block in said regular row/column memory cell array] *each of said blocks* is divided [by] *into* $2^n$ (n: a natural number) [into] sections, [the] *each* section constituting a minimal memory *cell array* unit.

13. The semiconductor memory device according to claim 11, wherein said first decoder is shared by adjacent blocks in the memory *cell* array.

14. The semiconductor memory device according to claim 11, wherein said first decoder [is composed of] *comprises* a row decoder.

15. The semiconductor memory device according to claim 11, wherein said second decoder [is composed of] *comprises* a column decoder.

*16. The semiconductor memory device according to claim 1, wherein each said column select line extends from said third peripheral circuit.*

*17. The semiconductor memory device according to claim 16, wherein said first decoder comprises a row decoder and said second decoder comprises a column decoder.*

*18. The semiconductor memory device according to claim 17, wherein said first peripheral circuit is provided between adjacent blocks divided in the column direction of the regular row/column memory cell array.*

*19. The semiconductor memory device according to claim 18, wherein said first peripheral circuit comprises a bus line extending in the row direction and coupled to said row decoder.*

*20. The semiconductor memory device according to claim 1, further comprising a fourth peripheral circuit provided at an outer margin of the regular row/column memory cell array, said fourth peripheral circuit comprising bonding pads and input protection circuitry.*

*21. The semiconductor memory device according to claim 1, further comprising gating circuits formed between neighboring sections of each of said four blocks.*

*22. The semiconductor memory device according to claim 21, wherein said regular row/column memory cell array, said first peripheral circuit, said second peripheral circuit, said third peripheral circuit, said sense amplifiers and said gating circuits are each formed on a single semiconductor chip.*

*23. The semiconductor memory device according to claim 6, wherein each of said sections further includes a bit line extending in the column direction.*

*24. The semiconductor memory device according to claim 23, wherein each of said sections includes a word line extending in the row direction and coupled to said second peripheral circuit.*

*25. The semiconductor memory device according to claim 24, wherein each of said blocks includes a column select line extending parallel to said bit lines.*

*26. The semiconductor memory device according to claim 25, wherein each said column select line extends across the sections in its respective block.*

*27. The semiconductor memory device according to claim 26, wherein each said column select line extends from said third peripheral circuit.*

*28. The semiconductor memory device according to claim 27, wherein said first decoder comprises a row decoder and said second decoder comprises a column decoder.*

*29. The semiconductor memory device according to claim 28, wherein said first peripheral circuit is provided between adjacent blocks divided in the column direction of the regular row/column memory cell array.*

*30. The semiconductor memory device according to claim 29, wherein said first peripheral circuit comprises a bus line extending in the row direction and coupled to said row decoder.*

*31. The semiconductor memory device according to claim 6, further comprising a fourth peripheral circuit provided at an outer margin of the regular row/column memory cell array including an area between the adjacent pair of blocks, said fourth peripheral circuit comprising bonding pads and input protection circuitry.*

*32. The semiconductor memory device according to claim 6, wherein each said block includes a column select line extending in the column direction.*

*33. The semiconductor memory device according to claim 32, wherein each said column select line extends across each of said sections in its respective block.*

*34. The semiconductor memory device according to claim 33, wherein each said section includes a word line extending in the row direction and coupled to said second peripheral circuit and a bit line extending in said column direction.*

*35. The semiconductor memory device according to claim 34, further comprising gating circuits formed between neighboring sections of each of said eight blocks.*

*36. The semiconductor memory device according to claim 35, wherein said regular row/column memory cell array, said first peripheral circuit, said second peripheral circuit, said third peripheral circuit, said sense amplifiers and said gating circuits are each formed on a single semiconductor chip.*

*37. The semiconductor memory device according to claim 11, wherein each of said sections further includes a bit line extending in the column direction.*

*38. The semiconductor memory device according to claim 37, wherein each of said sections includes a word line extending in the row direction and coupled to said second peripheral circuit.*

*39. The semiconductor memory device according to claim 38, wherein each of said blocks includes a column select line extending parallel to said bit lines.*

*40. The semiconductor memory device according to claim 39, wherein each said column select line extends across the sections in its respective block.*

*41. The semiconductor memory device according to claim 40, wherein each said column select line extends from said third peripheral circuit.*

*42. The semiconductor memory device according to claim 41, wherein said first decoder comprises a row decoder and said second decoder comprises a column decoder.*

*43. The semiconductor memory device according to claim 42, wherein said first peripheral circuit is provided between adjacent blocks divided in the column direction of the regular row/column memory cell array.*

*44. The semiconductor memory device according to claim 43, wherein said first peripheral circuit comprises a bus line extending in the row direction and coupled to said row decoder.*

*45. The semiconductor memory device according to claim 11, wherein each said block includes a column select line extending in the column direction.*

*46. The semiconductor memory device according to claim 45, wherein each said column select line extends across each of said sections in its respective block.*

*47. The semiconductor memory device according to claim 46, wherein each said section includes a word line extending in the row direction and coupled to said second peripheral circuit and a bit line extending in said column direction.*

*48. The semiconductor memory device according to claim 47, further comprising gating circuits formed between neighboring sections of each of said blocks.*

*49. The semiconductor memory device according to claim 48, wherein said regular row/column memory cell array, said first peripheral circuit, said second peripheral circuit, said third peripheral circuit, said sense amplifiers and said gating circuits are each formed on a single semiconductor chip.*

*50. A semiconductor memory device comprising:*

*a memory cell array having four blocks obtained by dividing the memory cell array in a column direction and a row direction, each of said four blocks of the row/column memory cell array including a plurality of minimal memory cell array units, and each of said four blocks of the memory cell array including at least one sense amplifier arranged between neighboring minimal memory cell array units, each of said minimal memory cell array units including a word line extending in the row direction and connected to the memory cells, a bit line extending in the column direction and connected to the memory cells, and a column select line extending parallel to the bit line;*

*a first peripheral circuit provided between the blocks divided in the column direction of the memory cell array;*

*a second peripheral circuit provided between adjacent blocks divided in the row direction of the memory cell array and including a first decoder; and*

*a third peripheral circuit provided in the column direction between the first peripheral circuit and the respective adjacent block and including a second decoder.*

*51. The semiconductor memory device according to claim 50, wherein each of said four blocks of the memory cell array further includes a gating circuit arranged between the neighboring minimal memory cell array units.*

*52. The semiconductor memory device according to claim 50, wherein said column select line extends across a plurality of minimal memory cell array units.*

*53. The semiconductor memory device according to claim 50, wherein said first peripheral circuit includes a group of signal lines extending in the row direction.*

*54. The semiconductor memory device according to claim 53, wherein said group of signal lines is connected to said first decoder.*

*55. The semiconductor memory device according to claim 50, further comprising a fourth peripheral circuit provided at an outer marginal portion of the memory cell array and including bonding pads and an input protection circuit, wherein said bonding pads are arranged in a longitudinal direction of the memory cell array.*

*56. The semiconductor memory device according to claim 50, wherein said memory cells of the memory cell array are RAMS.*

*57. The semiconductor memory device according to claim 56, wherein said RAMs are dynamic RAMs.*

*58. The semiconductor memory device according to claim 56, wherein said RAMs are static RAMs.*

*59. A semiconductor memory device, comprising:*

*memory cell array blocks arranged in rows and columns and each containing a plurality of memory sections each having memory cells connected to word lines extending in the row direction and bit lines extending in the column direction, said memory cell array blocks including first and second memory cell array blocks disposed in a first row of memory cell array blocks and third and fourth memory cell array blocks disposed in a second row of memory cell array blocks adjacent to said first row of memory cell array blocks;*

*select lines extending in the column direction across said respective memory sections of each said memory cell array block;*

*a first peripheral circuit arranged between (1) the first and second memory cell array blocks in said first row and (2) the third and fourth memory cell array blocks in said second row;*

*a second peripheral circuit having first and second peripheral circuit portions each including a decoder for selecting said word lines, said first peripheral circuit portion of said second peripheral circuit arranged between said first and second memory cell array blocks and said second peripheral circuit portion of said second peripheral circuit arranged between said third and fourth memory cell array blocks;*

*a third peripheral circuit having first, second, third, and fourth peripheral circuit portions each including a decoder for selecting said select lines, said first peripheral circuit portion of said third peripheral circuit arranged between the memory sections of said first memory cell array block and said first peripheral circuit, said second peripheral circuit portion of said third peripheral circuit arranged between the memory sections of said second memory cell array block and said first peripheral circuit, said third peripheral circuit portion of said third peripheral circuit arranged between the memory sections of said third memory cell array block and said first peripheral circuit, and said fourth peripheral circuit portion of said third peripheral circuit arranged between the memory sections of said fourth memory cell array block and said first peripheral circuit; and*

*sense amplifiers arranged between the memory sections of each of said memory cell array blocks.*

*60. The semiconductor memory device according to claim 59, further comprising:*

*a fourth peripheral circuit including circuit elements arranged around a periphery of said memory cell array blocks.*

*61. A semiconductor memory device, comprising:*

*memory cell array blocks arranged in rows and columns and each containing a plurality of memory sections each having memory cells connected to word lines extending in the row direction and bit lines extending in the column direction, said memory cell array blocks including first, second, third, and fourth memory cell array blocks disposed in a first row of memory cell array blocks and fifth, sixth, seventh, and eighth memory cell array blocks disposed in a second row of memory cell array blocks adjacent to said first row of memory cell array blocks;*

*select lines extending in the column direction across said respective memory sections of each said memory cell array block;*

*a first peripheral circuit arranged between (1) the first, second, third, and fourth memory cell array blocks in said first row and (2) the fifth, sixth, seventh, and eighth memory cell array blocks in said second row;*

*a second peripheral circuit having first, second, third, and fourth peripheral circuit portions each including a decoder for selecting said word lines, said first peripheral circuit portion of said second peripheral circuit arranged between said first and second memory cell array blocks, said second peripheral circuit portion of said second peripheral circuit arranged between said third and fourth memory cell array blocks, said third peripheral circuit portion of said second peripheral circuit arranged between said fifth and sixth memory cell array blocks, and said fourth peripheral circuit portion of said second peripheral circuit arranged between said seventh and eighth memory cell array blocks;*

*a third peripheral circuit having first, second, third, fourth, fifth, sixth, seventh, and eighth peripheral circuit portions each including a decoder for selecting the select lines connected to a corresponding one of said memory cell array blocks, each respective peripheral circuit portion of said third peripheral circuit arranged between the memory sections of the respective corresponding memory cell array block and said first peripheral circuit; and*

*sense amplifiers arranged between the memory sections of each of said memory cell array blocks.*

*62. A semiconductor memory device comprising:*

*a memory cell array having four blocks obtained by dividing the memory cell array in the column and row directions, wherein each of said four blocks are further divided in the column direction to form a plurality of sections;*

*a first peripheral circuit provided between the blocks divided in the column direction of the memory cell array, each of said sections further including a word line extending in the row direction and coupled to said first peripheral circuit;*

*a second peripheral circuit including first and second peripheral circuit portions which are spaced from each other in a same column, and third and fourth peripheral circuit portions which are spaced from each other in another same column, each of said first, second, third and fourth peripheral circuit portions including a first decoder, each of said first, second, third and fourth peripheral circuit portions being electrically coupled to one of said four blocks, respectively;*

*a third peripheral circuit provided in the column direction between the first peripheral circuit and the respective adjacent block and including a second decoder; and*

*sense amplifiers provided between neighboring sections in each of said four blocks.*

*63. The semiconductor memory device according to claim 62, wherein each of said four blocks is divided into $2^n$ (n: a natural number) sections, each section constituting a minimal memory cell array unit.*

*64. The semiconductor memory device according to claim 62, wherein said first decoder comprises a row decoder.*

*65. The semiconductor memory device according to claim 62, wherein said second decoder comprises a column decoder.*

*66. The semiconductor memory device according to claim 62, wherein each said column select line extends across the sections in its respective block.*

*67. The semiconductor memory device according to claim 66, wherein each said column select line extends from said third peripheral circuit.*

*68. The semiconductor memory device according to claim 67, wherein said first decoder comprises a row decoder and said second decoder comprises a column decoder.*

*69. The semiconductor memory device according to claim 68, wherein said first peripheral circuit comprises a bus line extending in the column direction and coupled to said row decoder.*

*70. The semiconductor memory device according to claim 62, wherein said memory cell array is a dynamic random access memory cell array.*

*71. The semiconductor memory device according to claim 62, wherein said memory cell array is a static random access memory cell array.*

*72. The semiconductor memory device according to claim 62, further comprising a fourth peripheral circuit provided at an outer margin of the memory cell array, said fourth peripheral circuit comprising bonding pads and input protection circuitry.*

*73. The semiconductor memory device according to claim 62, further comprising gating circuits formed between neighboring sections of each of said blocks.*

* * * * *